United States Patent
Reig et al.

(10) Patent No.: US 9,824,825 B2
(45) Date of Patent: Nov. 21, 2017

(54) CAPACITOR OF VARIABLE CAPACITY, COMPRISING A LAYER OF A PHASE CHANGE MATERIAL, AND METHOD FOR VARYING THE CAPACITY OF A CAPACITOR

(71) Applicant: COMMISSARIAT A L'ENERGIE ATOMIQUE ET AUX ENERGIES ALTERNATIVES, Paris (FR)

(72) Inventors: Bruno Reig, Moirans (FR); Jean-Claude Bastien, Plougastel Daoulas (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 146 days.

(21) Appl. No.: 14/965,004

(22) Filed: Dec. 10, 2015

(65) Prior Publication Data
US 2016/0172113 A1 Jun. 16, 2016

(30) Foreign Application Priority Data
Dec. 10, 2014 (FR) ..................................... 14 62194

(51) Int. Cl.
*H01G 7/06* (2006.01)
*H01L 49/02* (2006.01)
(Continued)

(52) U.S. Cl.
CPC ................. *H01G 7/06* (2013.01); *H01G 4/33* (2013.01); *H01L 28/75* (2013.01); *H01L 45/06* (2013.01);
(Continued)

(58) Field of Classification Search
None
See application file for complete search history.

(56) References Cited

U.S. PATENT DOCUMENTS 6,977,198 B2 12/2005 Gau
7,634,248 B2 12/2009 Xu et al.
(Continued)

FOREIGN PATENT DOCUMENTS

WO WO 2009/128048 A1 10/2009

OTHER PUBLICATIONS

French Preliminary Search Report with Written Opinion dated Oct. 26, 2015 in French Application 14 62194 filed on Dec. 10, 2014 (with English Translation of Categories of Cited Documents).
(Continued)

*Primary Examiner* — Dion R Ferguson
(74) *Attorney, Agent, or Firm* — Oblon, McClelland, Maier & Neustadt, L.L.P.

(57) ABSTRACT

The invention relates to a variable-capacitance electrical capacitor comprising a first electrode and a second electrode facing the first electrode and a zone of a dielectric material arranged between said first and second electrodes characterized in that the second electrode is formed at least on one hand of a primary electrode made of an electrically conductive material and, at least on the other, of an additional electrode comprising a state-change material, the primary electrode and the additional electrode facing the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary the electrically active surface area of the second electrode.

22 Claims, 5 Drawing Sheets

(51) Int. Cl.
H01G 4/33 (2006.01)
H01L 45/00 (2006.01)
(52) U.S. Cl.
CPC ........ H01L 45/085 (2013.01); H01L 45/1233 (2013.01); H01L 45/144 (2013.01); H01L 45/146 (2013.01)

(56) References Cited

U.S. PATENT DOCUMENTS

| | | | |
|---|---|---|---|
| 9,253,822 B2* | 2/2016 | Lamorey | H05B 3/023 |
| 2011/0038093 A1* | 2/2011 | Furukawa | B81B 3/0072 |
| | | | 361/277 |
| 2012/0280393 A1 | 11/2012 | Kaynak et al. | |
| 2014/0151628 A1* | 6/2014 | Li | H01L 45/1253 |
| | | | 257/4 |
| 2014/0376149 A1* | 12/2014 | Lamorey | H05B 3/023 |
| | | | 361/280 |
| 2016/0071653 A1* | 3/2016 | Lamorey | H05B 3/023 |
| | | | 361/282 |

OTHER PUBLICATIONS

Ali Tombak, et al., "Tunable Barium Strontium Titanate Thin Film Capacitors for RF and Microwave Applications" IEEE Microwave and Wireless Components Letters, vol. 12, (1), 2002, 3 pgs.
Arnaud Vena, et al., "A Fully Passive RF Switch Based on Nanometric Conductive Bridge", IEEE, 2012, 3 pgs.
Yonghyun Shim, et al., "RF Switches Using Phase Change Materials", IEEE, 2013, 4 pgs.

\* cited by examiner

CAPACITOR OF VARIABLE CAPACITY, COMPRISING A LAYER OF A PHASE CHANGE MATERIAL, AND METHOD FOR VARYING THE CAPACITY OF A CAPACITOR

FIELD OF THE INVENTION

The present invention relates to a variable-capacitance capacitor comprising a resistive state-change material and a capacitance variation method.

The invention will be applied in the field of microelectronics which includes nanotechnologies and notably in applications requiring components wherein the properties belong to the field of micro-electronics and more particularly in applications requiring components wherein the properties can be modified as needed.

STATE OF THE RELATED ART

The microelectronics industry is subject to significant miniaturization constraints in order to create ever more complex circuits in an ever smaller size. By way of example, in order to meet mobile telephony requirements, it is necessary to create circuits suitable for switching between the various telephone functions (telephony on different frequency bands, local area network, Internet, etc.) without increasing the size of the device.

From U.S. Pat. No. 6,977,198B1, metal-insulator-metal capacitors are known, embodied by alternating layers of metals and insulators suitable for placing two capacitors having a common electrode in parallel so as to obtain a higher capacitance value on an equivalent surface area. These capacitors are not suitable for varying the capacitance value.

In order to meet this demand, it is necessary to develop variable components wherein the properties can be modified as needed. In this context, variable capacitances are an essential component of the development of electronic circuits and in particular of RF (Radiofrequency) circuits.

The prior art includes switched capacitances in the form of Microelectromechanical systems (MEMS). In an MEMS switched capacitance as described in US-A1-2012/0280393, two capacitance states can be obtained by applying an electrostatic control signal suitable for moving an electrode suspended from the capacitance. The movement of this electrode makes it possible to vary the inter-electrode spacing of the capacitance thus modifying the capacitance value. Such a device makes use of a complex electromechanical design and must be protected by a packaging in order to be able to ensure the reliability thereof.

The prior art includes Metal Oxide Semiconductor (MOS) stacks and variable-capacitance varactor (from the term variable reactor) diodes or stacks with two electrodes encasing a ferroelectric type material wherein the dielectric constant can be modified continuously between two values by applying an external dielectric field thereto. In these three devices, the capacitance can be modified continuously between two values, but a DC voltage must remain applied to maintain a capacitance value.

Therefore, there is a need to propose a variable-capacitance capacitor which is readily integrable in micro-electronic circuits and preferably requiring little power to function.

SUMMARY OF THE INVENTION

The present invention proposes for this purpose a variable-capacitance capacitor which may be based on the principle of an MIM (Metal-Insulator-Metal) capacitor integrating a state-change material in order to be able to vary the capacitance value.

The capacitor according to the invention comprises a first and a second electrode facing one another and spaced apart by a dielectric material. The second electrode is formed at least on one hand of a primary electrode made of electrically conductive material and at least on the other of an additional electrode comprising a state-change material. The primary electrode and the additional electrode are respectively facing the first electrode. This positioning facing the second electrode is preferably according to a fixed orientation relative to the first electrode. The state-change material is at least partially arranged in contact with the primary electrode. The state-change material is configured to alternatively adopt a high-resistivity state and a low-resistivity state. In the low-resistivity state, the state-change material is conductive placing itself in electrical conduction with the primary electrode. In the high-resistivity state, the state-change material is resistant so as to isolate the primary electrode. The electrically active surface area of the second electrode is different according to state of the state-change material. This change of electrically active surface area induces a variation of the capacitance of the capacitor.

In this way, when the state-change material is in a high-resistivity state, the electrically active surface area of the second electrode facing the first electrode corresponds to the surface area of the primary electrode facing the first electrode. When the state-change material is in a low-resistivity state, the electrically active surface area of the second electrode corresponds to the sum of the surface areas of the primary electrode and the additional electrode facing the first electrode.

The invention preferably does not include any movable element to vary the capacitance notably, therefore, it does not require an adapted environment. This positioning facing the second electrode is preferably according to a fixed orientation relative to the first electrode. As such, there is no change of relative position in inclination between the active surface of the first electrode and that of the second. The angle formed by these surfaces is constant during the operation of the capacitor. This aspect makes it possible to ensure high reliability in operation insofar as any deformations of the second electrode, for example due to changes of state of the state-change material, do not impact the relative orientation of the electrodes.

The electrodes are preferably fixed relative to one another and notably the first electrode is fixed relative to the second electrode and conversely, at least in flexion along a direction moving said electrodes closer or further apart. This fixity signifies that the variation of the active surface area of the second electrode is not due to relative mobility of parts of both electrodes at least in flexion along a direction moving said electrodes closer or further apart. Overall, it is advantageous that the orthogonal projection, along the stack height direction, from one electrode to another is fixed on the surface, or negligibly variable in terms of the impact on capacitance variation.

According to a further aspect, the air gap between the two electrodes is fixed, or of negligible variation in terms of the influence thereof on capacitance variation.

According to a further aspect, the air gap, referring herein to the space separating the two electrodes, has an identical height along at least a portion of the surface facing the two electrodes. The surfaces facing the electrodes are preferably parallel. They are advantageously plane. These parameters are understood within manufacturing tolerances.

The capacitor according to the invention can adopt at least two capacitance values. The change between the various capacitance values is obtained on the basis of the state of the state-change material. Advantageously, the capacitor comprises control means configured to apply a control signal adapted to the level of the state-change material. Once the change has been made, the state-change material remains in a stable state until the next change. Preferentially, once the change of state has been made, the control signal can be switched off, the material is stable in the state thereof until the application of a new control signal. There is thus no energy consumption other than in state-change phases.

Furthermore, the invention uses state-change materials such as phase-change materials, which have a very good compatibility with MOS technologies suitable for producing on the same silicon wafer the capacitor according to the invention and the active circuits.

According to one preferred embodiment, the additional electrode comprises a layer of electrically conductive material arranged such that the state-change material is placed between the primary electrode and the layer of electrically conductive material of the additional electrode.

The invention also relates to a device comprising at least one capacitor according to the invention and means for controlling the state of the state-change material of this capacitor. The control means are advantageously configured to change said material from one state to another. As a general rule, one of the states is more electrically conductive than the other. One of the states is configured to allow an electrical continuity function whereas the second state is configured to carry out an electrical insulation function, in the sought application of the capacitor.

A further aspect of embodiments of the invention relates to a variable-capacitance electrical capacitor, comprising at least:

- a first stack (stack n) including a first electrode and a second electrode facing the first electrode and a zone of a dielectric material arranged between said first and second electrodes, wherein the second electrode is formed at least on one hand of a primary electrode made of an electrically conductive material and, at least on the other, of an additional electrode comprising a state-change material, the primary electrode and the additional electrode respectively facing the first electrode, preferably but not exclusively according to a fixed orientation relative to the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary the electrically active surface area of the second electrode,
- a second stack (stack n+1) comprising a third electrode and a fourth electrode facing the third electrode and a zone of a dielectric material arranged between said third and fourth electrodes, the fourth electrode is formed at least on one hand of a primary electrode made of an electrically conductive material and, at least on the other, of an additional electrode comprising a state-change material of the second stack, the primary electrode and the additional electrode of the fourth electrode respectively facing the third electrode, said state-change material of the second stack being arranged at least partially in contact with the primary electrode of the fourth electrode and being configured to alternatively adopt a high-resistivity state wherein the additional electrode of the third electrode is electrically insulated from the primary electrode and a low-resistivity state wherein the additional electrode of the fourth electrode is in electrical conduction with the primary electrode of the fourth electrode so as to vary the electrically active surface area of the fourth electrode, and wherein a part of the first electrode of the first stack forms the primary electrode of the second stack.

The invention also relates to a variable-capacitance capacitor comprising a plurality of stacks as described above. Advantageously, each stack is joined with the stack n+1 by the first electrode of the stack n which acts as the primary electrode of the second electrode of the stack n+1.

Advantageously, the first electrode of the stack n+1 is electrically connected to the second electrode of the stack n.

A method for varying the capacitance of a variable-capacitance capacitor according to the invention is also described, characterized in that it comprises the application of a signal for controlling the state of the state-change material of at least one stack so as to change same from a high-resistivity state wherein the additional electrode is electrically insulated from the primary electrode to a low-resistivity state wherein the additional electrode is in electrical conduction with the primary electrode so as to vary the electrically active surface area of the second electrode and as such the capacitance of the capacitor.

BRIEF DESCRIPTION OF THE FIGURES

The aims, subject matter, and features and advantages of the invention will emerge more clearly from the detailed description of an embodiment thereof which is illustrated by the accompanying figures wherein.

Figure 1:
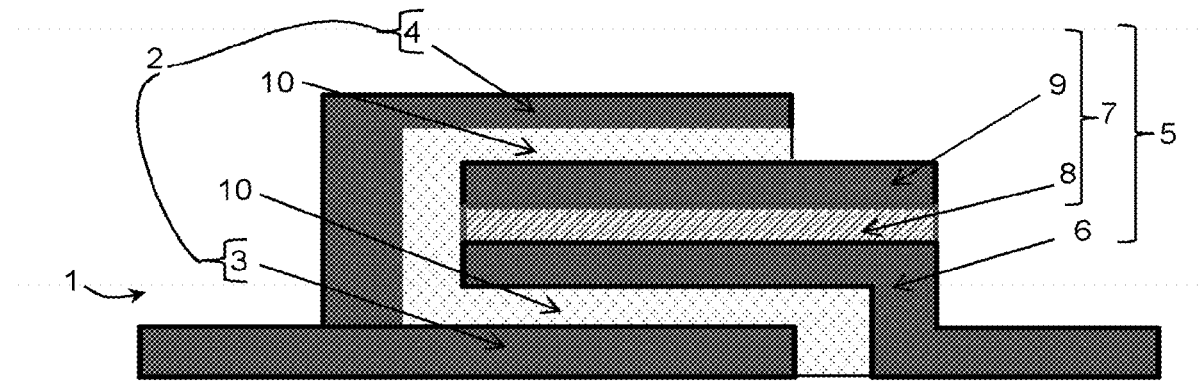
FIG. 1: Sectional view of a variable-capacitance capacitor according to a first embodiment.
Figure 2:
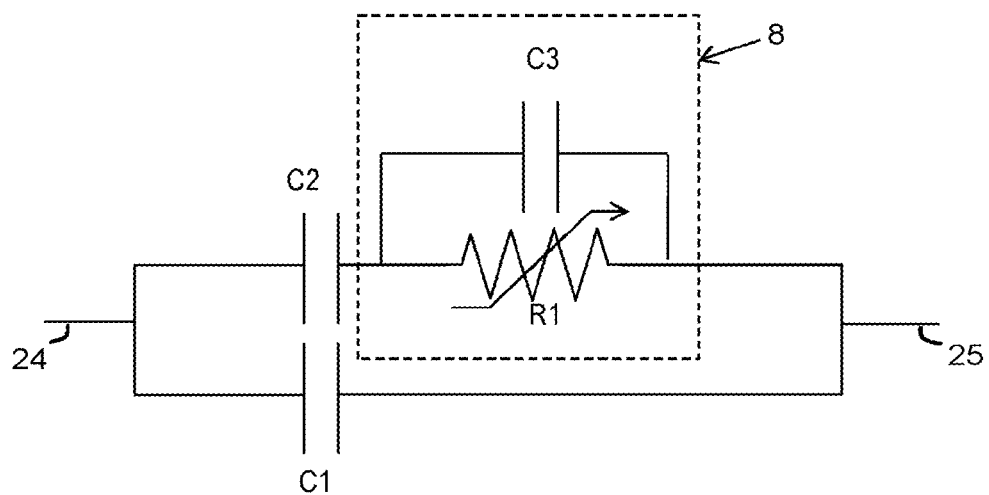
FIG. 2: Electrical diagram of the capacitor illustrated in FIG. 1.

The attached drawings are given by way of example and are not limiting in respect of the invention. They constitute schematic principle representations intended to facilitate the comprehension of the invention and are not necessarily to the scale of the practical applications.

In particular, the relative thicknesses of the different layers and films are not representative of reality.

DETAILED DESCRIPTION OF THE INVENTION

Before beginning a detailed review of embodiments of the invention, optional features which may optionally be used in association or alternatively are listed hereinafter.

It is first of all noted that the invention relates, according to one aspect, to a variable-capacitance electrical capacitor, comprising at least a first stack comprising a first electrode and a second electrode facing the first electrode and a zone of a dielectric material arranged between said first and second electrodes characterized in that the second electrode is formed at least on one hand of a primary electrode made of an electrically conductive material and, at least on the other, of an additional electrode comprising a state-change material, the primary electrode and the additional electrode facing the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary the electrically active surface area of the second electrode.

Advantageously, the additional electrode comprises a layer of electrically conductive material arranged such that the state-change material is placed at least partially between the primary electrode and the layer of electrically conductive material of the additional electrode. This sandwich arrangement is preferably oriented along a direction in respect of the thickness of the first stack. The phase-change material can thus be configured to place the primary electrode and the layer of electrically conductive material in electrical continuity or alternatively in electrical discontinuity, according to the more or less conductive state thereof. Preferentially, the layer of electrically conductive material of the additional electrode is in contact with the layer of state-change material.

Advantageously, the primary electrode and the additional electrode are at least partially superimposed.

Advantageously, the primary electrode and the additional electrode are in contact via the superimposed surfaces thereof.

Advantageously, the primary electrode and the additional electrode are in electrical conduction via the contact surfaces thereof.

Advantageously, the first electrode comprises a first layer of electrically conductive material and a second layer of electrically conductive material so as to encase the zone of dielectric material, the zone of dielectric material encasing the second electrode.

Advantageously, the primary electrode and the additional electrode are at least partially in the same plane.

Advantageously, the state-change material comprises a discontinuous layer forming patches placed in a dielectric material matrix.

Advantageously, the primary electrode is a discontinuous layer configured to allow an at least partial overlap with the discontinuous layer of state-change material, preferentially placed in a dielectric material matrix.

Advantageously, the layer of electrically conductive material of the additional electrode is a discontinuous layer configured to allow an at least partial overlap with the discontinuous layer of state-change material, preferentially placed in a dielectric material matrix.

Advantageously, the capacitor device comprises control means (also referred to as control member) of the state of the state-change material.

Advantageously, the state-change material is a bistable material, preferentially in a low-resistivity state and in a high-resistivity state in the absence of action of the control means.

Advantageously, the control means are configured to apply a difference in potential between the primary electrode and the layer of electrically conductive material of the additional electrode.

Advantageously, the control means comprise a heat source configured to generate heating of the state-change material.

Advantageously, the heat source comprises a light source.

Advantageously, the light source is a pulsed laser signal.

Advantageously, the capacitor comprises at least two stacks wherein one of the electrode chosen from the first or the second electrode of a stack n being common to an electrode chosen from the second of the first electrode of a stack n+1, said common electrode being formed on one hand of a primary electrode of the stack n+1 made of an electrically conductive material and, on the other, of an additional electrode comprising a state-change material, the primary electrode and the additional electrode respectively facing the first electrode of the stack n+1, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary the electrically active surface area of said common electrode.

Advantageously, the first electrode of a stack n a first layer of electrical conductive material and a second layer of electrically conductive material so as to encase the second electrode of the stack n and the zone of dielectric material and wherein the primary electrode of the second electrode of the stack n+1 is formed by the second layer of electrically conductive material of the first electrode of the stack n.

Advantageously, the first electrode of the stack n+1 is electrically connected to the primary electrode of the stack n so as to encase the second electrode of the stack n+1.

According to a further aspect, the invention relates to a method for varying the capacitance of a variable-capacitance capacitor as described above characterized in that it comprises the application of a signal for controlling the state of the state-change material of at least one stack so as to change same from a high-resistivity state wherein the additional electrode is electrically insulated from the primary electrode and a low-resistivity state wherein the additional electrode is in electrical conduction with the primary electrode so as to vary the electrically active surface area of the second electrode and as such the capacitance of the capacitor.

Advantageously, the application of a control signal is of a duration limited to the change of state of the state-change material, when the state-change material is bistable.

Advantageously, the control signal is a difference in potential applied between the layer of electrically conductive material of the primary electrode and the layer of electrically conductive material of the additional electrode.

Advantageously, the control signal is a heating of the state-change material generated by a heat source.

Advantageously, the heat source is a light source.

Advantageously, the light source is a pulsed laser signal.

It is specified that, within the scope of the present invention, the term "on", "on top of" or "underlying" or the equivalents thereof do not necessarily mean "in contact with". As such, for example, the deposition of a first layer on a second layer does not necessarily mean that the two layers are directly in contact with one another but this means that the first layer at least partially covers the second layer while being either directly in contact therewith or being separated therefrom by a further layer or a further element.

It is established that the electrical capacitance of a capacitor is essentially determined on the basis of the geometry of the electrodes and the nature of the insulator(s); the following simplified formula is frequently used to estimate the value thereof:

$$C = \varepsilon \frac{S}{e} \quad \text{Formula I}$$

where S: surface area of the facing electrodes, e distance between the electrodes et ∈ the dielectric permittivity.

The term electrically active surface area of the second electrode denotes the surface area of the second electrode 5 facing the first electrode 2 and which is in an electrically conductive state.

The capacitor according to the invention is formed on a substrate 20, for example made of passivated silicon.

The capacitor according to the invention comprises a first stack comprising a first electrode 2 and a second electrode 5 facing one another and spaced apart by a zone of dielectric material 10.

More generally, the capacitor comprises a first reinforcement and a second reinforcement. The facing portions of the first reinforcement and the second reinforcement respectively constitute the first electrode 2 and the second electrode 5.

The zone of dielectric material 10 spaces the first electrode 2 and the second electrode 5 apart. The term zone denotes one or a plurality of interconnected layers of dielectric material. The zone 10 preferentially comprises at least one layer of at least one dielectric material and as illustrated in FIGS. 1 and 3 to 7 at least two connected layers. By way of example, the at least one dielectric material is chosen from SiO2 or SiN. Preferentially, the dielectric material is deposited by PECVD (Plasma-Enhanced Chemical Vapor Deposition). The dielectric material is preferentially the same throughout the zone 10.

The first electrode 2 is made of electrically conductive material. Preferentially, the first electrode comprises at least one first layer of electrically conductive material 3.

According to the invention, the second electrode 5 comprises a primary electrode 6 and an additional electrode 7. The primary electrode 6 comprises a layer of electrically conductive material and preferentially the primary electrode 6 is made of electrically conductive material. The additional electrode 7 comprises a state-change material 8. The primary electrode 6 and the additional electrode 7 are facing the first electrode 2.

The primary electrode 6 and the additional electrode 7 are at least partially in contact with one another. According to an example illustrated in FIGS. 1 to 7, the primary electrode 6 and the additional electrode 7 are at least partially superimposed. According to a further example illustrated in FIG. 8, the primary electrode 6 and the additional electrode 7 are on the same stack level, preferentially in contact in the plane.

The state-change material 8 is a material wherein a resistive transition can be observed. The state-change material 8 is configured to alternatively adopt a high-resistivity state and a low-resistivity state. The state-change material 8 is said to be in a high-resistivity state, when the resistance thereof is typically of the order of 1 MΩ. The state-change material 8 is said to be in a low-resistivity state when the resistance thereof is typically of the order of 1Ω. The ratio defined between the resistance of the state-change material in a high-resistivity state and the resistance thereof in a low-resistivity state is between 10, preferentially 100, and 1,000,000. A ratio of 10, preferentially 100, is defined between the resistance of the state-change material in a high-resistivity state and the resistance thereof in a low-resistivity state. This material preferably has zero or negligible thermal expansion. The volume variation thereof, during the use of the capacitor, may be less than 3% or even 1%.

The total capacitance of the capacitor Ctot is measured between the two terminals 24, 25 of the first electrode 2 and of the primary electrode 6 of the second electrode 5.

In the high-resistivity state, the resistance of the state-change material 8 is such that it acts as an insulator and does not conduct electrical current.

In the low-resistivity state, the resistance of the state-change material 8 is such that it allows conduction of electrical current.

This difference in state gives rise to a variation of the electrically active surface area of the second electrode 5 and as such a variation in the capacitance of the capacitor according to formula I given above. In a high-resistivity state, the electrically active surface area of the second electrode 5 corresponds to the surface area of the primary electrode 6 facing the first electrode 2. In a low-resistivity state, the electrically active surface area of the second electrode 5 corresponds to the sum of the surface areas of the primary electrode 6 facing the first electrode 2 and the surface area of the additional electrode 7 facing the first electrode 2.

According to one preferred embodiment illustrated in all the figures, the additional electrode 7 comprises a layer of electrically conductive material 9 arranged such that the state-change material 8 is situated at least partially between the primary electrode 6 and the layer of electrically conductive material 9 of the additional electrode 7.

According to a first possibility of this embodiment, the first electrode 2 comprises a first layer of electrically conductive material 3 and a second layer of electrically conductive material 4 which are electrically connected. The first layer of electrically conductive material 3 at least partially facing the primary electrode 6 spaced apart by at least a portion of the zone of dielectric material 10. The second layer of electrically conductive material 4 at least partially facing the additional electrode 7 spaced apart by at least a portion of the zone of dielectric material 10. The first electrode 2 encases the second electrode 5 and the zone of dielectric material. The first electrode has a U shape. More specifically, it is possible to obtain the stack illustrated in FIG. 1 and the alternative embodiments thereof illustrated in FIGS. 3 to 6.

Defined differently, the capacitor according to the invention successively comprises at least one stack comprising from bottom to the top at least:
  a first capacitance comprising:
    a first layer of conductive material forming a first electrode,
    a first layer of dielectric material,
    a second layer of conductive material forming a second electrode,
  a second capacitance comprising:
    a third layer of conductive material forming a third electrode,
    a second layer of dielectric material,
    a fourth layer of conductive material forming a fourth electrode.

According to this definition, the stack of the capacitor comprises a layer of state-change material arranged between the second electrode and the third electrode configured to alternatively adopt a low-resistivity state wherein the second electrode and the third electrode are in electrical continuity and a high-resistivity state wherein the second electrode and the third electrode are electrically insulated and the first layer of conductive material and the fourth layer of conductive material are electrically connected.

A first capacitance C1 of the capacitor is formed between the first electrode 2 and the primary electrode 6 spaced apart by at least a portion of the zone of dielectric material 10.

A second capacitance C2 of the capacitor is formed between the first electrode 2 and the additional electrode 7 spaced apart by at least a portion of the zone of dielectric material 10.

The term portion of the zone of dielectric material 10 denotes a part of the zone forming a layer between two layers of electrically conductive material.

When the state-change material 8 is in a low-resistivity state:
  the layer of conductive material 9 of the additional electrode 7 is electrically connected to the primary electrode 6. In this case, the layer of conductive material 9 of the additional electrode 7 and the primary electrode 6 form a common electrode, the second electrode 5. As the first layer of conductive material 3 and the second layer of conductive material 4 also form a common electrode by design, the first electrode 2, thus the second capacitance C2 is positioned electrically in parallel on C1 between the two terminals 24, 25 of the capacitor. The total capacitance Ctot of the capacitor is thus the resultant of the capacitances C1 and C2 placed in parallel;
  the layer of conductive material 9 is in electrical continuity with the primary electrode 6. The electrically active surface area of the second electrode 5 comprises the surface area of the primary electrode 6 facing the first electrode 2, more specifically facing the first layer of conductive material 3 and the surface area of the additional electrode 7, i.e. the layer of conductive material 9 if it is present or, failing this, the surface area of the state-change material 8, facing the first electrode 2, more specifically of the second layer of electrically conductive material 4;
  and as the electrical model of the state-change material 8 can be considered to be a resistor R1, the value whereof is dependent on the state of said state-change material 8, in parallel with a capacitance C3, the value whereof is essentially dependent on the width of the primary electrode 6, the thickness of the state-change material 8 and the thickness of the layer of conductive material 9 of the additional electrode 7 and as in the diagram illustrated in FIG. 2. According to this diagram, when the state-change material is in a low-resistivity state, the layer of conductive material 9 of the additional electrode 7 is electrically connected to the primary electrode 6 by the resistor R1 and can be considered to be a common electrode, the second electrode 5. As the first layer of conductive material 3 and the second layer of conductive material 4 also form a common electrode by design, the first electrode 2 thus the second capacitance C2 is positioned electrically in parallel on C1 between the two terminals 24, 25 of the capacitor. The total capacitance Ctot of the capacitor is thus the resultant of the capacitances C1 and C2 placed in parallel, C3 being negligible.

On the other hand, when the state-change material 8 is in a high-resistivity state:
  the layer of conductive material 9 of the additional electrode 7 is electrically insulated from the primary electrode 6 by the high resistance of the state-change material 8. In this case, the total capacitance Ctot is solely equal to C1;
  only the primary electrode 6 forms an electrically active surface area of the second electrode 5;
  and as the electrical model of the state-change material 8 can be considered to be a resistor R1, the value whereof is dependent on the state of said state-change material 8, in parallel with a capacitance C3, the value whereof is essentially dependent on the width of the primary electrode 6, the thickness of the state-change material 8 and the thickness of the layer of conductive material 9 of the additional electrode 7 and as in the diagram illustrated in FIG. 2. According to this diagram, when the state-change material 8 is in a high-resistivity state, the layer of electrically conductive material 9 of the additional electrode 7 is electrically insulated from the primary electrode 6 by the high resistance of the state-change material 8 and electrically connected to the primary electrode 6 by a capacitance C3. In this case, the total capacitance Ctot of the capacitor is considered to be the resultant of the capacitance C1 placed in parallel with the two capacitances in series C2 and C3.

The layers of electrically conductive materials 3, 4, 6, 9, are for example metals such as nickel (Ni), silver (Ag), aluminum (Al), copper (Cu), gold (Au) or tungsten (W) deposited for example using a PVD (Physical Vapor Deposition) method. Besides the metals, these materials may be any type of electrical conductors such as for example semiconductors (doped silicon for example), metal oxides (e.g.: ruthenium oxide $RuO_2$, iridium oxide $IrO_2$) of transparent conductive films (e.g.: conductive oxide such as ITO, conductive polymer such as PEDOT).

The geometric patterns of the layers of electrically conductive materials are then formed for example by photolithography etching steps.

Preferentially, intermediate layers of TiN for example may be deposited between the layers of conductive materials, the dielectric material and the state-change material to form passivation layers or bonding layers. These layers are neither detailed, nor represented in the figures as they are not functional within the scope of the present invention.

The capacitor according to the invention comprises means for controlling the state of the state-change material 8.

Preferentially according to the invention, the state-change materials 8 are of the phase-change type and preferentially use Joule-effect heating to change state.

According to one possibility, this Joule-effect heating is performed preferably by applying a difference in potential to generate a current pulse in the state-change material 8.

Advantageously, the resistive transition of the state-change material 8 is controlled by the layer of electrically conductive material 9 of the additional electrode 7.

The control means comprise according to one possibility a control line connected to the layer of electrically conductive material 9 intended to apply a polarization voltage between the control line and the terminal 24 of the primary electrode 6. The polarization voltages required to obtain the change of state of the state-change material 8 are of the order of a few Volts (1 to 10V) and the power required of the order of some ten mW This arrangement makes it possible to feed the control signal of the change of state via an independent control line of the input and output terminals 24, 25, which allows the separation of the control signal from the signal to be transmitted.

Figure 6:
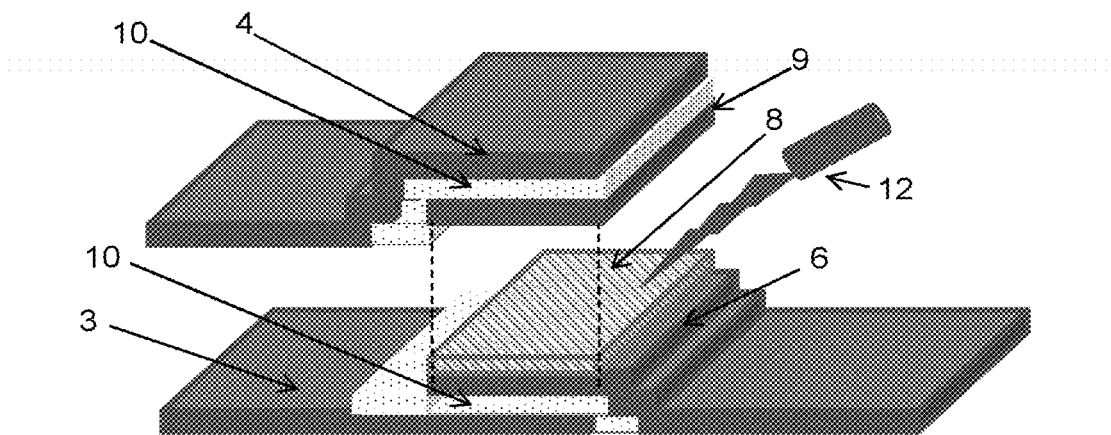
FIG. 6: Partially exploded perspective view of a third alternative embodiment of the first embodiment.

According to a further possibility, any heating source allowing intense and brief heating of the state-change material 8 may be used. It is possible for example to control the change of state using a laser pulse as illustrated in FIG. 6. The control means comprise a heat source, for example a light source notably laser type pulsed light. According to this possibility, the layer of conductive material 9 of the additional electrode 7 can be retained as a mere floating electrode or may be removed.

Figure 3:
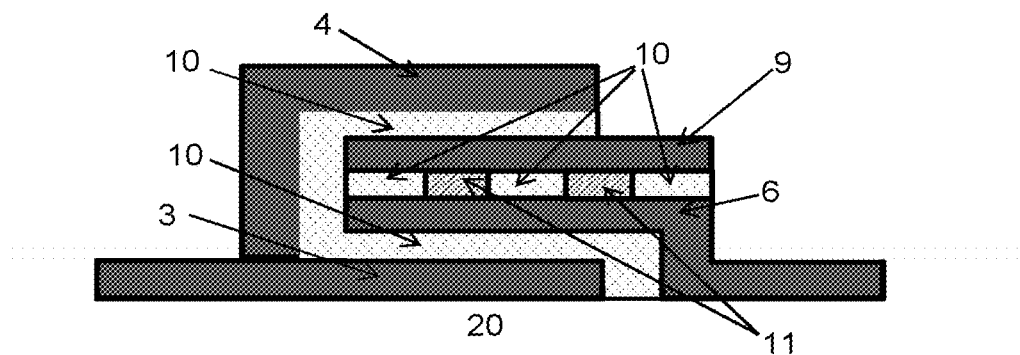
FIG. 3: Sectional view of a variable-capacitance capacitor according to a first alternative embodiment of the first embodiment.
Figure 4:
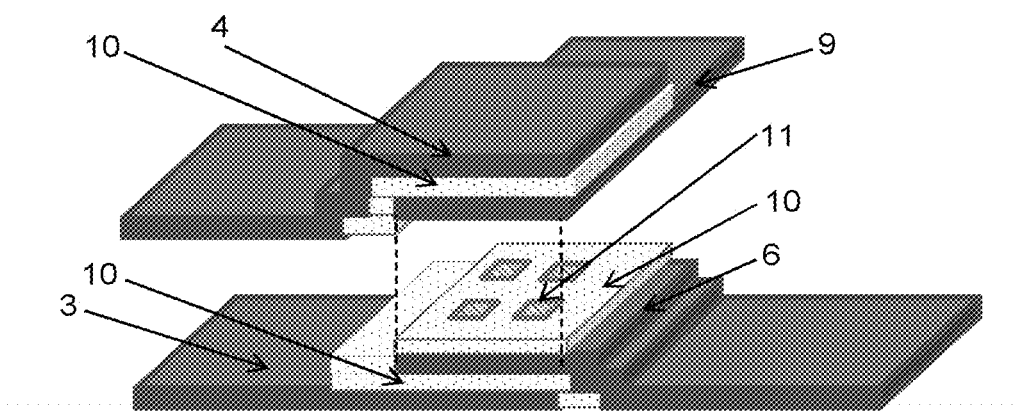
FIG. 4: Partially exploded perspective view according to FIG. 3.
Figure 5:
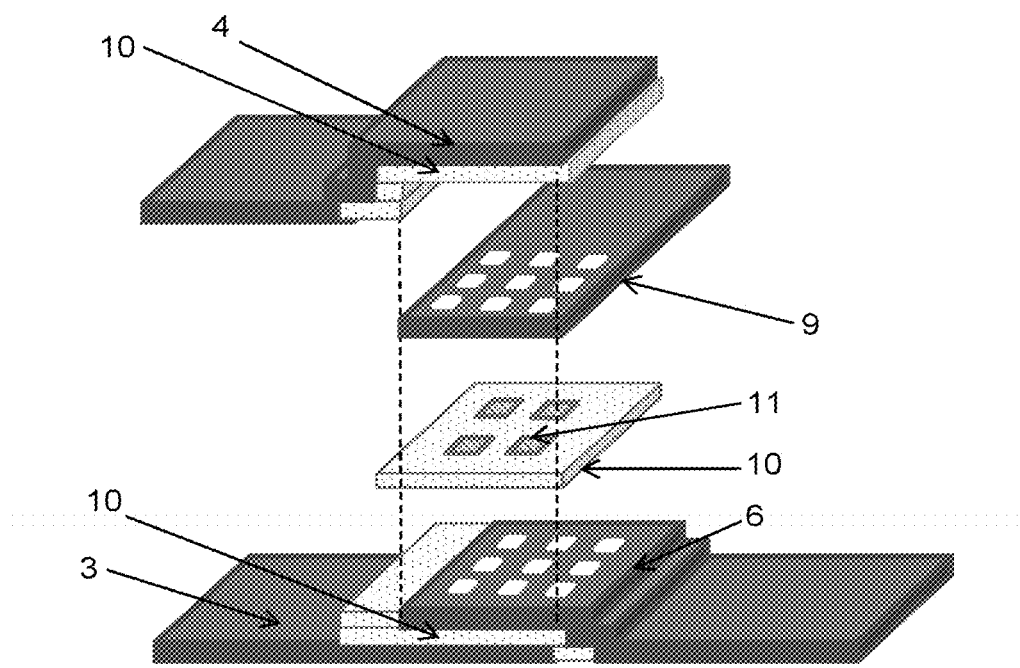
FIG. 5: Partially exploded perspective view of a second alternative embodiment of FIG. 3.

According to one embodiment illustrated in FIGS. 3 to 5, the state-change material 8 can be replaced by at least one patch 11 of this state-change material place in a matrix of dielectric material 10. The geometric dimensions of this patch are sufficiently small to enable more effective resistive transition, i.e. with a higher resistance contrast. The change of state also requires less energy.

Preferentially, the stack 1 of the capacitor comprises a network of patches 11, illustrated in FIGS. 3 to 5. This network arrangement makes it possible to reduce the total resistance between the primary electrode 6 and the layer of conductive material 9 of the additional electrode 7 when the state-change material 8 is in a low-resistivity state.

The patches 11 can adopt different geometric shapes whether they are lines or blocks.

The patches 11 can be controlled by common or independent control means.

In the case as in FIGS. 3 and 4, the control line of the layer of conductive material 9 of the additional electrode 7 can be replaced by a network of control lines, each line controlling the resistive transition of a patch 11 of state-change material 8. It is then possible to independently control each patch 11 in order to be certain of having a complete resistive transition on all the patches 11. This individual control also makes it possible to be able to switch each patch 11 separately in order to be able to obtain a plurality of resistance values. The state-change material 8 thus becomes an adjustable resistive layer suitable for adopting a plurality of resistance values.

The layer of conductive material 9 of the additional electrode 7 is comparable to an electrode for controlling the state of the state-change material 8. In the embodiment where the state-change material 8 is in the form of patches 11, the layer of conductive material 9 of the additional electrode 7 is preferentially in the form of a gate. This gate is preferentially complementary to the network of patches 11 of the state-change material 8. The shape of the gate is preferentially configured to enable an at least partial overlap with the patches 11. There is contact between the patches 11 and the gate.

This gate shape as in FIG. 5 makes it possible concentrate the electric field lines and/or the flow of current in the patches. The primary electrode 6 can be optimized as follows.

Figure 7:
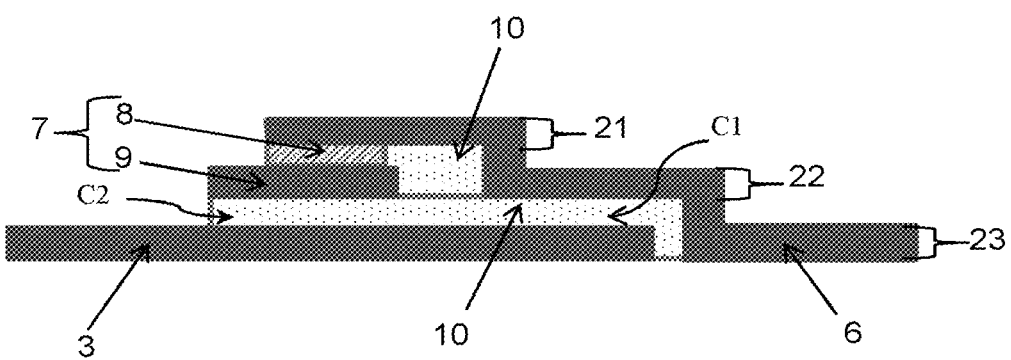
FIG. 7: Sectional view of a variable-capacitance capacitor according to a second embodiment.
Figure 8:
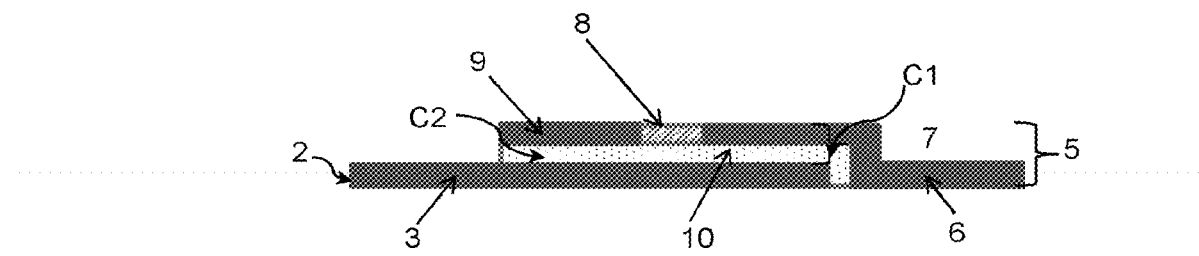
FIG. 8: Sectional view of a variable-capacitance capacitor according to a third embodiment.

According to a second embodiment of the invention, the capacitor is defined in a plane in order to embody an adjustable capacitor using less technological levels. An example of this embodiment is illustrated in FIG. 7.

The capacitor comprises a first electrode 2 comprising a planar layer of conductive material 3 and a second electrode 5 comprising a primary electrode 6 made of conductive material and an additional electrode 7 comprising a state-change material 8 and a layer of electrically conductive material 9. The state-change material 8 is placed between the primary electrode 6 and the layer of electrically conductive material 9. A zone of dielectric material 10 separates the first electrode 2 from the second electrode 5. The layer of electrically conductive material 9 is arranged facing the first electrode 2, more specifically facing the layer of electrically conductive material 3.

In this way, the stack 1 of the capacitor comprises at least one less level of conductive material than the embodiment illustrated in the preceding FIGS. 1 to 6.

The stack comprises from bottom to top on a substrate 20 a layer of conductive material 3 forming the first electrode 2, followed by a zone of dielectric material 10, followed by a layer of electrically conductive material 9 forming a part of the additional electrode 7, followed by a state-change material 8, followed by a layer of electrically conductive material forming the primary electrode 6. This primary electrode 6 forms a plurality of levels of conductive material from top to bottom, more specifically on three levels: above and in contact with the state-change material 8, level 21, then on the same level 22 as the layer of electrically conductive material 9 but separated by a zone of dielectric material 10, then at the level 23 of the layer of conductive material 3 of the first electrode 2 but separated by a zone of dielectric material 10.

The level 22 of the primary electrode 6 facing the layer of conductive material 3 of the first electrode 2 spaced apart by a zone of dielectric material 10 forms a first capacitance C1.

A second capacitance C2 is formed by the layer of electrically conductive material 9 facing the layer of conductive material 3 of the first electrode 2 spaced apart by a zone of dielectric material 10.

When the state-change material 8 is in a high-resistivity state, the total capacitance measured between the terminals 24, 25 of the first electrode 2 and the second electrode 5 is close to the value of the capacitance C1 measured between the parts of the first electrode 2 and the second electrode 5 facing one another i.e. between the first electrode 2 facing the primary electrode 6.

When the state-change material is in a low-resistivity state, then the primary electrode 6 can be considered to be electrically connected to the layer of conductive material 9 of the additional electrode 7. The primary electrode 6 and the layer of conductive material 9 of the additional electrode 7 thus form the second electrode 5. In this case, the total capacitance measured between the terminals 24, 25 of the first electrode 2 and of the primary electrode 6 is close to the resultant of the capacitances C1 and C2 placed in parallel, C2 being the capacitance formed by the facing parts of the first electrode 2 and of the state-change material 8 or of the layer of conductive material 9 of the additional electrode 7 if present.

The invention also relates to a capacitor comprising n stacks, between 2 and 10, more preferentially between 2 and 5. Hereinafter in the description, reference is made to first and second stack: a first stack 1 and a second stack 13. Preferentially, the stacks are identical.

Each stack advantageously comprises a first electrode, a second electrode and a layer of dielectric material. One of the two electrodes comprises a layer of state-change material.

Figure 9:
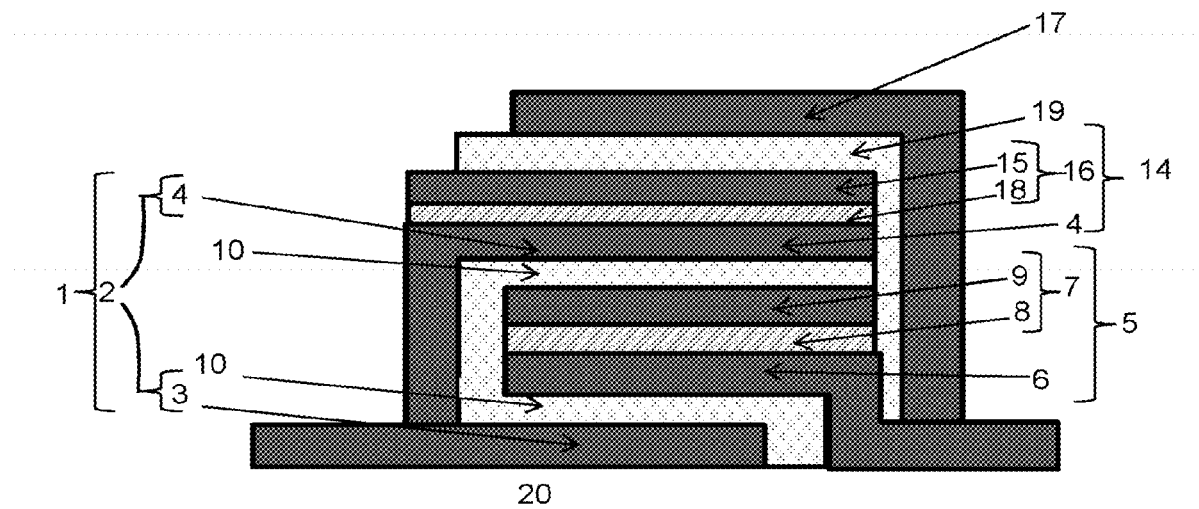
FIG. 9: Sectional view of a variable-capacitance capacitor comprising two stacks according to the first embodiment.
Figure 10:
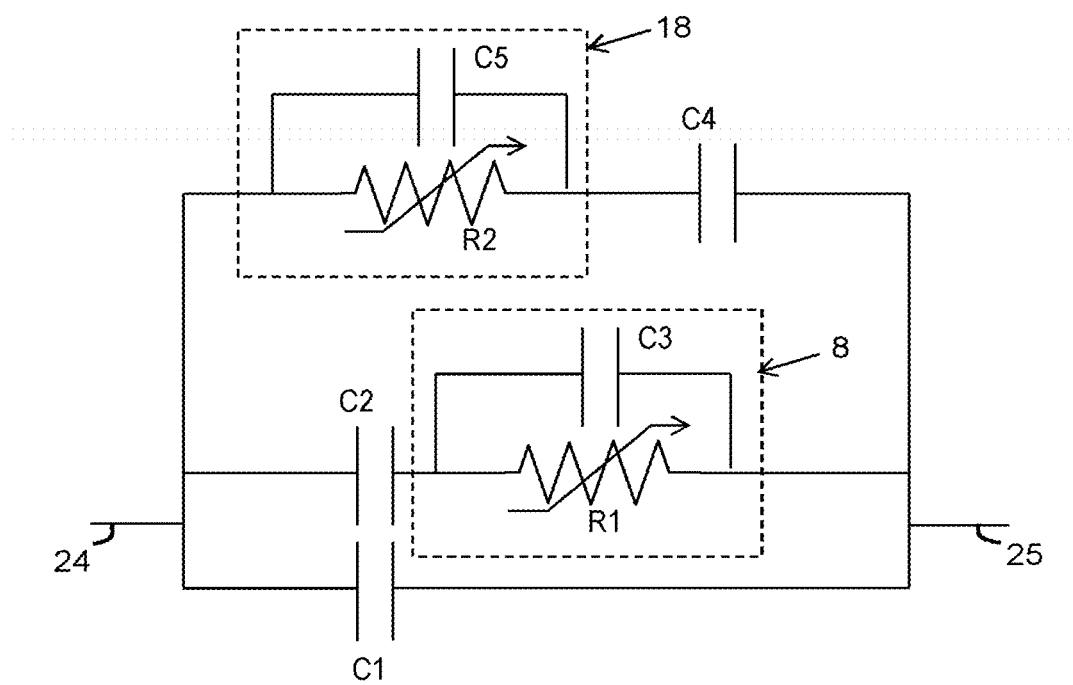
FIG. 10: Electrical diagram of the capacitor illustrated in FIG. 9.

The capacitor comprises a plurality of levels of state-change materials 8, 18. In FIG. 9, an example is given comprising two stacks 1 and 13, i.e. two layers of state-change materials 8, 18. Advantageously, the system comprises a common electrode to the first stack 1 and to the second stack 13. According to one embodiment, the common electrode is the first electrode 2 of the first stack 1 which then constitutes the primary electrode of the second stack 13.

According to the invention, the first stack 1 comprises, as described above, a first electrode 2 and a second electrode 5 facing the first electrode 2 and a zone of dielectric material 10 arranged between said first and second electrodes, the second electrode 5 is formed on one hand of a primary electrode 6 made of an electrically conductive material and, on the other, of an additional electrode 7 comprising a state-change material 8, the primary electrode 6 and the additional electrode 7 facing the first electrode 2, said state-change material 8 being arranged at least partially in contact with the primary electrode 6 and configured to alternatively adopt a high-resistivity state wherein the additional electrode is electrically insulated from the primary electrode and a low-resistivity state wherein the additional electrode is in electrical conduction with the primary electrode 6 so as to vary the electrically active surface area of the second electrode 5.

The second stack 13 comprises a second electrode 14 and a first electrode 17 facing the second electrode 14 and a zone of a dielectric material 10 arranged between said second and first electrodes, the second electrode 14 is formed on one hand of a primary electrode made of an electrically conductive material and, on the other, of an additional electrode 16 comprising a state-change material 18. The primary electrode and the additional electrode 16 facing the first electrode 17, said state-change material 18 being arranged at least partially in contact with the primary electrode and configured to alternatively adopt a high-resistivity state wherein the additional electrode 16 is electrically insulated from the primary electrode and a low-resistivity state wherein the additional electrode 16 is in electrical conduction with the primary electrode so as to vary the electrically active surface area of the second electrode 14. Preferentially, the primary electrode of the second stack 13 is the first electrode 2 of the first stack 1 and more specifically the layer of conductive material 4.

The first electrode 17 of the second stack 13 is electrically connected to the second electrode 5 of the first stack 1.

According to the invention, the additional electrode 16 of the second electrode 14 comprises the state-change material 18 and a layer of electrically conductive material 15.

Preferentially, the resistive transitions of these two layers of state-change materials 8,18 are controlled by two separate control lines formed by layers of electrically conductive materials 9, 15.

With a capacitor with two stacks as described above, four different capacitance values can be obtained:

Value 1: the two state-change materials 8, 18 are in a high-resistivity state.
In the first stack:
the second electrode 5 of the first stack 1 is formed by the first primary electrode 6 only, facing the first layer of conductive material 3 of the first electrode 2;
the layer of conductive material 9 of the additional electrode 7 is electrically insulated from the primary electrode 6 by the high resistance of the state-change material 8.
In the second stack 13:
the layer of conductive material 15 of the additional electrode 16 is electrically insulated from the primary electrode 4 by the high resistance of the state-change material 18.

In this case, the total capacitance Ctot of the device is only equal to C1 formed between the primary electrode 6 of the first stack and the layer of conductive material 3 of the first stack 1.

Value 2: the first layer of state-change material 8 is in a low-resistivity state and the second layer 18 in a high-resistivity state.
In the first stack:
the second electrode 5 of the first stack is formed by the primary electrode 6 facing the first layer of conductive material 3 of the first electrode 2 and the layer of electrically conductive material 9 of the additional electrode 7 facing the second layer of conductive material 4 of the first electrode 2.
In the second stack 13:
the layer of conductive material 15 of the additional electrode 16 is electrically insulated from the primary electrode 4 of the second stack by the high resistance of the state-change material 18.

In this case, the total capacitance Ctot of the device is equal to the resultant of the capacitances C1 and C2 placed in parallel, C1 being formed between the primary electrode 6 of the first stack and the layer of conductive material 3 of the first stack 1 and C2 between the layer of conductive material 4 of the first electrode 2 of the first stack 1 and the layer of conductive material 9 of the additional electrode 7 of the first stack.

Value 3: the first layer of state-change material 8 is in a high-resistivity state and the second layer 18 in a low resistivity state.
In the first stack:
the second electrode 5 is formed by the primary electrode 6 only, facing the first layer of conductive material 3 of the first electrode 2;
the layer of conductive material 9 of the additional electrode 7 is electrically insulated from the primary electrode 6 by the high resistance of the state-change material 8.
In the second stack 13:
the second electrode 14 is formed by the primary electrode 4 electrically connected to the layer of conductive material 3 of the first electrode 2 of the first stack 1 and by the layer of electrically conductive material 15 of the additional electrode 16 of the second stack 13 facing the layer of conductive material of the first electrode 17 electrically connected to the primary electrode 6 of the first stack 1.

In this way, the total capacitance Ctot of the capacitor is equal to the resultant of the capacitances C1 and C4 placed in parallel, C1 being formed between the primary electrode 6 of the first stack 1 and the layer of conductive material 3 of the first stack 1 and C4 between the first electrode 17 and the layer of conductive material 15 of the second stack 13.

Value 4: the two layers of state-change material 8,18 are in a low-resistivity state.
In the first stack:
the second electrode 5 of the first stack 1 is formed by the primary electrode 6 facing the first layer of conductive material 3 of the first electrode 2 and by the layer of electrically conductive material 9 of the additional electrode 7 facing the second layer of conductive material 4 of the first electrode 2.
In the second stack 13:
the second electrode 14 is formed by the layer of conductive material of the primary electrode 4 electrically connected to the layer of conductive material 3 of the first electrode 2 and by the layer of electrically conductive material 15 of the additional electrode 16 facing the layer of conductive material of the first electrode 17 electrically connected to the primary electrode 6 of the first stack 1.

In this way, the total capacitance Ctot of the capacitor is equal to the resultant of the capacitances C1, C2 and C4 placed in parallel, C1 being formed between the primary electrode 6 of the first stack 1 and the layer of conductive material 3 of the first stack 1, C2 between the layer of conductive material 4 of the first electrode 2 of the first stack 1 and the layer of conductive material 9 of the first stack 1 and C4 between the layer of conductive material of the first electrode 17 and the layer of conductive material 15 of the second stack 13.

According to one possibility of the invention, the state-change material 8,18 is a phase-change material such as Ge2Sb2Te5 or GeTe wherein a resistance contrast of $10^6$ can be obtained following Joule-effect heating. This modification is due to the rapid and reversible change between a high-resistivity amorphous phase and a low-resistivity crystalline phase.

According to one possibility, the state-change material 8,18 is an insulator such as a chalcogenide glass, for example GeTe, GeSe, GeS, AsS or an insulator such as an oxide such as SiO2 or WO3. Preferentially, according to this possibility, the primary electrode 6 is made of Nickel or Aluminum and the additional electrode 7 comprises a layer of electrically conductive material 9 made of silver or copper. Advantageously, according to this possibility, the state-change material 8,18 is doped with a mobile metal element such as silver or copper. Applying a polarized electrical pulse between the primary electrode 6 and the layer of electrically conductive material 9 of the additional electrode 7 makes it possible to form a conductive bridge between the primary electrode 6 and the layer of electrically conductive material 9 of the additional electrode 7, or on the other hand break this conductive bridge by inverting the polarization, by ion displacement or oxidoreduction mechanisms.

According to a further possibility, the state-change material 8, 18 is an active oxide such as a transition metal oxide such as NiO, TiO, CuO, ZrO, HfO. The resistive transition is obtained by creating a conductive bridge in the oxide when applying an electric field between the primary electrode 6 and the layer of electrically conductive material 9 of the additional electrode 7 or breaking this bridge when inverting the polarization.

The state-change material 8, 18 can be deposited by PVD or CVD (Chemical Vapor Deposition) methods, and the patterns are then formed by photolithography etching steps.

In the embodiment comprising a plurality of layers of state-change materials 8, 18, as in the system of capacitors according to the invention, the layers of state-change materials 8, 18 may be identical or different.

The invention also relates to a method for varying the capacitance of a capacitor as described above. The method comprises the application of a signal for controlling the state of the state-change material 8 so as to change same from a high-resistivity state wherein the additional electrode 7 is electrically insulated from the primary electrode 6 and a low-resistivity state wherein the additional electrode 7 is in electrical conduction with the primary electrode 6 so as to vary the electrically active surface area of the second electrode 5 and as such the capacitance of the capacitor.

A detailed example of the steps of production of a capacitor according to the invention is given hereinafter. On a supporting substrate 20, for example a silicon substrate passivated with a layer of SiO2 (silicon dioxide), a first electrode 2 is embodied. This electrode 2 made of conductive material is for example embodied with W (Tungsten) 200 nm in thickness deposited by PVD (Physical Vapor Deposition) and the pattern of the electrode 2 is embodied by photolithography and RIE (reactive ionic etching).

A first level of dielectric material 10 is embodied, for example by PECVD (Plasma Enhanced Chemical Vapor Deposition) deposition of 100 nm of SiN followed by photolithography and etching of the patterns by RIE.

Deposition of a second level of electrically conductive material forming the primary electrode 6 consisting for example of a layer of TiN 50 nm in thickness and a layer of W 200 nm in thickness deposited by PVD. The patterns are embodied by photolithography followed by successive RIE of W followed by TiN.

The state-change material 8, for example GeTe 100 nm in thickness, is then deposited between two layers of TiN of 5 nm. This entire stack is deposited by PVD and the patterns are then formed by photolithography and IRE (Ion Beam Etching) etching of the stack.

Deposition of a third level of electrically conductive material 9 partially forming the additional electrode 7 consisting for example of a layer of TiN 15 nm in thickness and a layer of W 200 nm in thickness deposited by PVD. The patterns are embodied by photolithography followed by successive RIE etching of W followed by TiN.

A second level of dielectric material 10 is embodied, for example by a PECVD deposition of 100 nm of SiN followed by photolithography and etching of the patterns by RIE.

Finally, the final layer of electrically conductive material partially forming the first electrode 2 is embodied. This electrode made of conductive material 4 is for example composed of a stack of TiN 50 nm in thickness and of W 200 nm in thickness deposited by PVD and the pattern of the electrode is embodied by a photolithography step and successive RIE etching of W and TiN.

REFERENCES

1. First stack
2. First electrode
3. First layer of electrically conductive material
4. Second layer of electrically conductive material/Primary electrode
5. Second electrode
6. Primary electrode
7. Additional electrode
8. State-change material
9. Layer of electrically conductive material
10. Zone of dielectric material
11. Patch of state-change material
12. Laser control
13. Second stack
14. Second electrode
15. Layer of electrically conductive material
16. Additional electrode
17. First electrode
18. State-change material
19. Zone of dielectric material
20. Substrate
21. Level
22. Level
23. Level
24. Terminal
25. Terminal
C1. First capacitance C2. Second capacitance
C3. Third capacitance
R1. Resistor of third capacitance
C4. Fourth capacitance
C5. Fifth capacitance
R2. Resistor of fifth capacitance

The invention claimed is:

1. A variable-capacitance electrical capacitor, comprising at least a first stack including a first electrode and a second electrode facing the first electrode and a zone of a dielectric material arranged between said first and second electrodes,
wherein the second electrode is formed at least on one hand of a primary electrode made of an electrically conductive material and, at least on the other hand, of an additional electrode comprising a state-change material, the primary electrode and the additional electrode respectively facing the first electrode according to a fixed orientation relative to the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary an electrically active surface area of the second electrode.

2. The capacitor according to claim 1 wherein the additional electrode comprises a layer of electrically conductive material arranged such that the state-change material is placed at least partially between the primary electrode and the layer of electrically conductive material of the additional electrode along a direction in respect of a thickness of the first stack.

3. The capacitor according to claim 1 wherein the primary electrode and the additional electrode have superimposed surfaces in contact with one another.

4. The capacitor according to claim 1 wherein the first electrode comprises a first layer of electrically conductive material and a second layer of electrically conductive material electrically connected so as to encase the zone of dielectric material, which is encasing the second electrode.

5. The capacitor according to claim 1 wherein the primary electrode and the additional electrode are at least partially in the same plane.

6. The capacitor according to claim 1 wherein the state-change material comprises a discontinuous layer forming patches placed in a dielectric material matrix.

7. The capacitor according to claim 6 wherein the primary electrode is a discontinuous layer configured to allow an at least partial overlap with the discontinuous layer of state-change material.

8. The capacitor according to claim 2 wherein the layer of electrically conductive material of the additional electrode is a discontinuous layer configured to allow an at least partial overlap with a discontinuous layer of the state-change material.

9. The capacitor according to claim 1 wherein the state-change material is a bistable material.

10. A device comprising a capacitor according to claim 1 and control means of the state of the state-change material.

11. The device according to claim 6 comprising an independent control means of the state of the state-change material for each patch.

12. The device according to claim 10 comprising a capacitor wherein the additional electrode comprises a layer of electrically conductive material arranged such that the state-change material is placed at least partially between the primary electrode and the layer of electrically conductive material of the additional electrode along a direction in respect of a thickness of the first stack, and wherein the control means are configured to apply a difference in potential between the primary electrode and the layer of electrically conductive material of the additional electrode.

13. The device according to claim 10, wherein the control means comprise a heat source configured to generate heating of the state-change material.

14. The device according to claim 13 wherein the heat source comprises a light source.

15. A variable-capacitance electrical capacitor, comprising at least:
a first stack including a first electrode and a second electrode facing the first electrode and a zone of a dielectric material arranged between said first and second electrodes, first stack wherein the second electrode is formed at least on one hand of a primary electrode made of an electrically conductive material and, at least on the other, of an additional electrode comprising a state-change material, the primary electrode and the additional electrode respectively facing the first electrode according to a fixed orientation relative to the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary an electrically active surface area of the second electrode,
a second stack comprising a third electrode and a fourth electrode facing the third electrode and a zone of a dielectric material arranged between said third and fourth electrodes, the fourth electrode is formed at least on one hand of a primary electrode made of an electrically conductive material and, at least on the other, of an additional electrode comprising a state-change material of the second stack, the primary electrode and the additional electrode of the fourth electrode respectively facing the third electrode, said state-change material of the second stack being arranged at least partially in contact with the primary electrode of the fourth electrode and being configured to alternatively adopt a high-resistivity state wherein the additional electrode of the fourth electrode is electrically insulated from the primary electrode of the fourth electrode and a low-resistivity state wherein the additional electrode of the fourth electrode is in electrical conduction with the primary electrode of the fourth electrode so as to vary the electrically active surface area of the fourth electrode,
and wherein a part of the first electrode of the first stack forms the primary electrode of the second stack.

16. The capacitor according to claim 15 wherein the first electrode of the first stack comprises a first layer of electrically conductive material and a second layer of electrically conductive material electrically connected so as to encase the third electrode of the second stack and a zone of dielectric material and wherein the primary electrode of the second stack is formed by a second layer of electrically conductive material of the first electrode of the first stack.

17. The capacitor according to claim 15, wherein the third electrode of the second stack is electrically connected to the primary electrode of the first stack, so as to encase the fourth electrode of the second stack.

18. A method for varying the capacitance of a variable-capacitance capacitor, which includes at least a first stack including a first electrode and a second electrode facing the first electrode and a zone of a dielectric material arranged between said first and second electrodes, wherein the second electrode is formed at least on one hand of a primary electrode made of an electrically conductive material and, at least on the other hand, of an additional electrode comprising a state-change material, the primary electrode and the additional electrode respectively facing the first electrode according to a fixed orientation relative to the first electrode, said state-change material being arranged at least partially in contact with the primary electrode and configured to alternatively adopt a high-resistivity state wherein the additional electrode is electrically insulated from the primary electrode and a low-resistivity state wherein the additional electrode is in electrical conduction with the primary electrode so as to vary an electrically active surface area of the second electrode, the method comprising:

application of a control signal for controlling the state of the state-change material so as to change same from a high-resistivity state wherein the additional electrode is electrically insulated from the primary electrode to a low-resistivity state wherein the additional electrode is in electrical conduction with the primary electrode so as to vary the electrically active surface area of the second electrode and as such the capacitance of the capacitor.

19. The method according to claim 18 wherein the application of the control signal is of a duration limited to the change of state of the state-change material, the latter being bistable.

20. The method according to claim 18 wherein a capacitor is used wherein the additional electrode comprises a layer of electrically conductive material arranged such that the state-change material is placed at least partially between the primary electrode and the layer of electrically conductive material of the additional electrode along a direction in respect of a thickness of the first stack, and wherein the control signal is a difference in potential applied between the layer of electrically conductive material of the primary electrode and the layer of electrically conductive material of the additional electrode.

21. The method according to claim 18 wherein the control signal is a heating of the state-change material generated by a heat source.

22. The method according to claim 21 wherein the heat source is a light source.

* * * * *